US010006970B2

(12) United States Patent
Rivas et al.

(10) Patent No.: US 10,006,970 B2
(45) Date of Patent: Jun. 26, 2018

(54) ELECTRONIC COMPARISON CIRCUIT TO IDENTIFY AT LEAST THREE CONDITIONS OF AN INPUT SIGNAL

(71) Applicant: Allegro MicroSystems, LLC, Worcester, MA (US)

(72) Inventors: Manuel Rivas, Ciudad de Buenos Aires (AR); Juan Manuel Cesaretti, Ciudad de Buenos Aires (AR); Pablo Javier Bolsinger, Provincia de Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 254 days.

(21) Appl. No.: 14/661,042

(22) Filed: Mar. 18, 2015

(65) Prior Publication Data
US 2015/0268312 A1    Sep. 24, 2015

Related U.S. Application Data

(60) Provisional application No. 61/954,843, filed on Mar. 18, 2014.

(51) Int. Cl.
| G01R 33/06 | (2006.01) |
| G01R 33/00 | (2006.01) |
| H03K 5/125 | (2006.01) |
| G01R 33/07 | (2006.01) |
| G01R 33/09 | (2006.01) |

(52) U.S. Cl.
CPC ......... *G01R 33/0023* (2013.01); *G01R 33/07* (2013.01); *G01R 33/09* (2013.01); *H03K 5/125* (2013.01)

(58) Field of Classification Search
CPC .... G01R 33/0023; G01R 33/07; G01R 33/09; H03K 5/125
See application file for complete search history.

(56) References Cited

U.S. PATENT DOCUMENTS

2010/0264909 A1* 10/2010 Scheller ............ G01R 33/0029
324/207.2

OTHER PUBLICATIONS

Flash ADC, available at http://en.wikipedia.org/wiki/Flash_ADC on Apr. 20, 2012.*
Bretschneider et al.; "Design of Multi-Dimensional Magnetic Position Sensor Systems Based on HallinOne Technology;" 2010 IEEE International Symposium on Industrial Electronics; Jul. 4-7, 2010; pp. 422-427.

* cited by examiner

*Primary Examiner* — Daniel Miller
(74) *Attorney, Agent, or Firm* — Daly, Crowley, Mofford & Durkee, LLP

(57) ABSTRACT

An electronic comparison circuit can identify at least three conditions of an input signal received by the electronic comparison circuit. A first one of the at least three conditions occurs when a value of the input signal is less than a first threshold value, a second one of the at least three conditions occurs when a value of the input signal is greater than the first threshold value and less than a second threshold value, and a third one of the at least three conditions occurs when a value of the input signal is greater than the second threshold value. A magnetic field sensor can use the electronic comparison circuit.

41 Claims, 11 Drawing Sheets

| Q1 | Q2 | SIGNAL EVALUATION |
|---|---|---|
| Low | Low | Input < LOWER Threshold |
| Low | High | LOWER Threshold < Input < UPPER Threshold |
| High | Low | Not a valid combination |
| High | High | Input > UPPER Threshold |

*FIG. 4*

ELECTRONIC COMPARISON CIRCUIT TO IDENTIFY AT LEAST THREE CONDITIONS OF AN INPUT SIGNAL

CROSS REFERENCE TO RELATED APPLICATIONS

This application claims the benefit under 35 U.S.C. § 119(e) of U.S. Provisional Application No. 61/954,843, filed Mar. 18, 2014, which application is incorporated herein by reference in its entirety.

STATEMENT REGARDING FEDERALLY SPONSORED RESEARCH

Not Applicable.

FIELD OF THE INVENTION

This invention relates generally to electronic comparison circuits and, more particularly, to an electronic comparison circuit that can identify at least three conditions of an input signal.

BACKGROUND

Electronic comparators are known. Electronic comparators receive an input signal and provide a binary, two-state, output signal, wherein a first state of the output signal is representative of the input signal being above a threshold level, and a second different state of the output signal is representative of the input signal being below the threshold level.

Electronic comparators with hysteresis are also known. Electronic comparators with hysteresis use two threshold levels, an upper threshold level and a lower threshold level. Electronic comparators with hysteresis receive an input signal and provide a binary, two-state, output signal. A first state of the output signal is representative of the input signal being above the upper threshold level, and a second different state of the output signal is representative of the input signal being below the lower threshold level.

Electronic comparators with hysteresis suffer from disadvantages. For example, when the comparator with hysteresis first powers up, it may be that the input signal is between the upper and lower threshold levels. Still, upon power up, the binary output signal of the electronic comparator with hysteresis must take on one of the two binary states. It will be understood that the output signal of the electronic comparator with hysteresis may not properly represent a value of the input signal when the electronic comparators first powers up, and it can be at an undesirable state, or at an unpredictable state.

Thus, it would be desirable to provide an electronic comparator with hysteresis for which an output signal from the electronic comparator with hysteresis is properly indicative of a condition of the input signal even immediately upon power up of the comparator with hysteresis.

Magnetic field sensors for detecting ferromagnetic articles and/or magnetic articles are also known. The magnetic field associated with the ferromagnetic article or magnetic article is detected by a magnetic field sensing element, such as a Hall element or a magnetoresistance element, which provides a signal (i.e., a magnetic field signal) proportional to a detected magnetic field. In some arrangements, the magnetic field signal is an electronic signal.

Some magnetic field sensors are rotation sensors operable to detect passing gear teeth of a ferromagnetic gear, or alternately, passing poles of a multi-pole ring magnet. Other magnetic field sensors are proximity sensor operable to detect when a magnet is proximate to the magnetic field sensor. Other magnetic field sensors are position sensors operable to detect a position of a multi-pole line magnet.

The magnetic field sensor processes the magnetic field signal and can generate a binary, two-state, output signal that changes state each time the magnetic field signal crosses thresholds, either near to peaks (positive and/or negative peaks) or near to some other level, for example, zero crossings of the magnetic field signal. Therefore, for rotation sensors, the binary output signal has an edge rate or period indicative of a speed of rotation of the ferromagnetic or magnetic object, for example, a gear or a ring magnet.

Some magnetic field sensors include a permanent magnet disposed therein, and the magnetic field sensor is responsive to perturbations of a magnetic field as the gear rotates or an a ferromagnetic object moves proximate to the magnetic field sensor.

Many types of magnetic field sensors include a comparator with or without hysteresis to receive an input signal representative of a magnetic field sensed by a magnetic field sensing element, The magnetic field sensor can to generate the above-described binary, two-state, output signal in response to the input signal.

Some types of magnetic field sensors provide the binary, two-state, output signal immediately upon power up of the magnetic field sensor. These types of magnetic field sensors can have the same types of disadvantages described above in conjunction with the comparator with hysteresis.

One particular type of magnetic field sensor, a "true power on state" (TPOS) detector, attempts to provide a reasonably accurate output signal shortly after movement of a target object (e.g., camshaft) from zero rotating speed. However, still the TPOS detector can suffer from the same types of disadvantages described above in conjunction with the comparator with hysteresis.

It would, therefore, be desirable to provide a magnetic field sensor that can provide an output signal that is properly indicative of a condition of a magnetic field signal even immediately upon power up of the magnetic field sensor.

SUMMARY

The present invention provides an electronic comparison circuit for which an output signal from the electronic comparison circuit is properly indicative of a condition of an input signal even immediately upon power up of the electronic comparison circuit.

In some embodiments, the present invention also provides a magnetic field sensor that can provide an output signal that is properly indicative of a condition of a magnetic field signal even immediately upon power up of the magnetic field sensor.

In accordance with an example useful in understanding an aspect of the invention, an electronic comparison circuit includes a comparator having an inverting terminal, a non-inverting terminal, and an output terminal. The electronic comparison circuit can also include a first resistor having first and second ends, wherein the second end of the first resistor is coupled to the non-inverting terminal. The electronic comparison circuit can also include a second resistor having first and second ends, wherein the second end of the second resistor is coupled to the inverting terminal, wherein at least one of the first end of the first resistor or the first end of the second resistor is coupled to receive an input signal. The electronic comparison circuit can also include a first electronic switch having a first current conducting terminal, a second current conducting terminal, and a control terminal, wherein the first electronic switch is operable to pass a first current between the first and second current conducting terminals of the first electronic switch in response to a signal at the control terminal, wherein the second current conducting terminal of the first electronic switch is coupled to the first end of the first resistor. The electronic comparison circuit can also include a second electronic switch having a first current conducting terminal, a second current conducting terminal, and a control terminal, wherein the second electronic switch is operable to pass the first current between the first and second current conducting terminals of the second electronic switch in response to a signal at the control terminal, wherein the second current conducting terminal of the second electronic switch is coupled to the first end of the second resistor. The electronic comparison circuit can also include a third electronic switch having a first current conducting terminal, a second current conducting terminal, and a control terminal, wherein the third electronic switch is operable to pass a second current between the first and second current conducting terminals of the third electronic switch in response to a signal at the control terminal, wherein the second current conducting terminal of the third electronic switch is coupled to the second end of the second resistor. The electronic comparison circuit can also include a fourth electronic switch having a first current conducting terminal, a second current conducting terminal, and a control terminal, wherein the fourth electronic switch is operable to pass the second current between the first and second current conducting terminals of the fourth electronic switch in response to a signal at the control terminal, wherein the second current conducting terminal of the fourth electronic switch is coupled to the second end of the first resistor. The electronic comparison circuit can also include a first logic gate having an input terminal, an output terminal, and a control terminal, wherein the input terminal of the first logic gate is coupled to the output terminal of the comparator, The electronic comparison circuit can also include a second logic gate having an input terminal, an output terminal, and a control terminal, wherein the input terminal of the second logic gate is coupled to the output terminal of the comparator. The electronic comparison circuit can also include a logic module operable to generate first, second, third, and fourth control signals, wherein the first control signal is coupled to the control terminals of a selected two the first, second, third and fourth electronic switches, the second control signal is coupled to the control terminals of a different selected two of the first, second, third, and fourth electronic switches, the third control signal is coupled to the control terminal of the first logic gate, and the fourth control signal is coupled to the control terminal of the second logic gate.

In accordance with another example useful in understanding another aspect of the invention, a method of identifying an amplitude of an input signal includes in an electronic comparison circuit, generating at least two output signals which are together representative of at least three conditions of the input signal to the electronic comparison circuit, wherein a first one of the at least three conditions occurs when a value of the input signal is less than a first threshold value, a second one of the at least three conditions occurs when a value of the input signal is greater than the first threshold value and less than a second threshold value, and a third one of the at least three conditions occurs when a value of the input signal is greater than the second threshold value.

In accordance with another example useful in understanding another aspect of the invention, a magnetic field sensor includes at least one magnetic field sensing element operable to generate a magnetic field signal responsive to a magnetic field. The magnetic field sensor can also include an electronic comparison circuit coupled to receive an input signal representative of the magnetic field signal, wherein the electronic comparison circuit comprises at least two output terminals, a respective output signal generated at each one of the at least two output terminals, wherein states of the output signals at the two output terminals of the electronic comparison circuit are representative of at least three conditions of the input signal.

In accordance with another example useful in understanding another aspect of the invention, a method of sensing a magnetic field includes generating a magnetic field signal responsive to a magnetic field, The method can also include generating, in response to an input signal representative of the magnetic field signal, at least two output signals wherein states of the at least two output signals are representative of at least three conditions of the input signal.

BRIEF DESCRIPTION OF THE DRAWINGS

The foregoing features of the invention, as well as the invention itself may be more fully understood from the following detailed description of the drawings, in which:

FIG. 4 is a chart showing states of output signals generated by the two logic gates of the electronic comparison circuit of FIG. 2 in relation to amplitudes of a differential input signal received by the electronic comparison circuit of FIG. 2;

DETAILED DESCRIPTION

Figure 1:
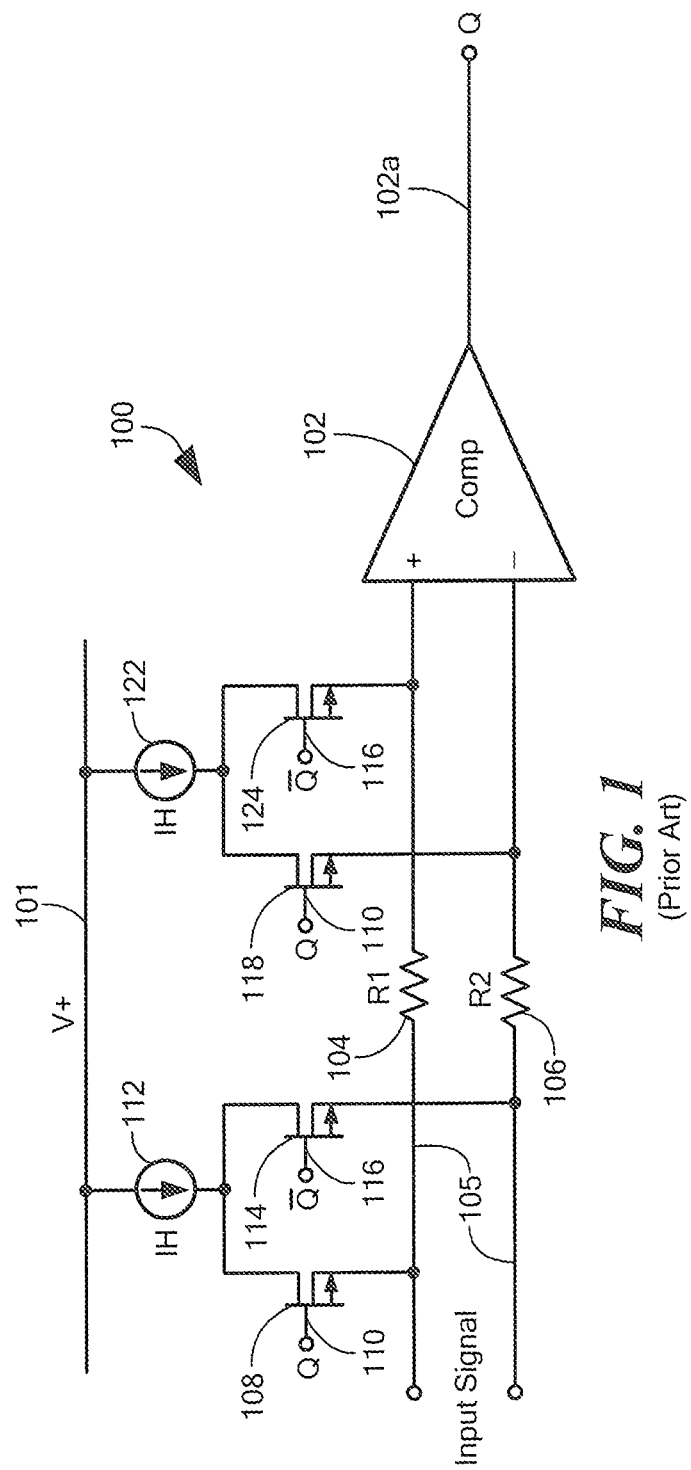
FIG. 1 is a block diagram showing a prior art electronic comparison circuit.

As used herein, the term "magnetic field sensing element" is used to describe a variety of electronic elements that can sense a magnetic field. The magnetic field sensing element can be, but is not limited, to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations, The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuit shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

As used herein, the term "predetermined," when referring to a value or signal, is used to refer to a value or signal that is set, or fixed, in the factory at the time of manufacture. As used herein, the term "determined," when referring to a value or signal, is used to refer to a value or signal that is identified by a circuit during operation, after manufacture.

As used herein, the term "comparator" is used to describe an analog electronic circuit that has two input terminals and an output terminal, and that has a high gain between the input terminals and the output terminal. A positive or negative difference between input signal values at the two input terminals determines a state of an output signal at the output terminal.

As used herein, the term "current generator" is used to describe either a current source circuit or a current sink circuit.

As used herein, the term "active electronic component" is used to describe and electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

Referring to FIG. 1, an example of a conventional electronic comparison circuit 100 with hysteresis can include a comparator 102 having an inverting terminal, a non-inverting terminal, and an output terminal at which a binary, two-state, output signal 102a is generated. A first resistor 104 has first and second ends, wherein the second end of the first resistor is coupled to the non-inverting terminal. A second resistor 106 has first and second ends, wherein the second end of the second resistor is coupled to the inverting terminal. The first end of the first resistor 104 and the first end of the second resistor 106 are coupled to receive a differential input signal 105 from a signal source (not shown) with a low output impedance.

A first electronic switch 108 (e.g., first field effect transistor) has a first current conducting terminal (e.g., a drain terminal), a second current conducting terminal (e.g., a source terminal), and a control terminal (e.g., a gate terminal). The first electronic switch is operable to pass a first current generated by a first current source 112 between the drain and source terminals of the first electronic switch 108 in response to a first control signal 110 at the control terminal of the first electronic switch 108. The source terminal of the first electronic switch 108 is coupled to the first end of the first resistor 104.

A second electronic switch 114 (e.g., second field effect transistor) has a first current conducting terminal (e.g., a drain terminal), a second current conducting terminal (e.g., a source terminal), and a control terminal (e.g., a gate terminal). The second electronic switch 114 is operable to pass the first current generated by the first current source 112 between the drain and source terminals of the second electronic switch 114 in response to a second control signal 116 at the control terminal of the second electronic switch 114. The source terminal of the second electronic switch 114 is coupled to the first end of the second resistor 106.

A third electronic switch 118 (e.g., third field effect transistor) has a first current conducting terminal (e.g., a drain terminal), a second current conducting terminal (e.g., a source terminal), and a control terminal (e.g., a gate terminal). The third electronic switch 118 is operable to pass a second current generated by a second current source 122 between the drain and source terminals of the third electronic switch 118 in response to the first control signal 110 at the control terminal of the third electronic switch 118. The source terminal of the third electronic switch 118 is coupled to the second end of the second resistor 106.

A fourth electronic switch 124 (e.g., fourth field effect transistor) has a first current conducting terminal (e.g., a drain terminal), a second current conducting terminal (e.g., a source terminal), and a control terminal (e.g., a gate terminal). The fourth electronic switch 124 is operable to pass the second current generated by the second current source 122 between the drain and source terminals of the fourth electronic switch 124 in response to the second control signal 116 at the control terminal of the fourth electronic switch 124. The source terminal of the fourth electronic switch 124 is coupled to the second end of the first resistor 104.

As used herein, the term "current conducting terminal" is used to refer to a terminal of an active electronic component that can either input a current or output a current. Thus, it should be recognized that, although the drain terminals of the first, second, third, and fourth electronic switches 108, 114, 118, 124 are referred to above as first current conducting terminals and the source terminals of the first, second, third, and fourth electronic switches 108, 114, 118, 124 are referred to above as second current conducting terminals, the reverse naming, exchanging first for second and vice versa, is also be possible. The same is true for all electronic switches described herein.

Control terminals of the first and third electronic switches 108, 118, respectively, are coupled to receive the first control signal 110, which can be representative of the binary, two-state, output signal 102*a* generated at the output terminal of the comparator 102.

Control terminals of the second and fourth electronic switches 114, 124, respectively, are coupled to receive the second control signal 114, which can be representative of an inverse of the binary, two-state, output signal 102*a* generated at the output terminal of the comparator 102.

As described above, the first and second currents are generated by the first and second current sources 112, 122, respectively, (e.g., current generators) coupled to the drains of the first and second electronic switches and to the drains of the third and fourth electronic switches, respectively. The currents generated by the first and second current sources can have the same value of current.

As the current is injected into either the first resistor 104 or into the second resistor 106, and received by the low impedance source that generates the differential input signal 105, by operation of the electronic switches 108, 114, 118, 124, it should be understood that voltages across the first and second resistors 104, 106 can change, resulting in two different thresholds for the electronic comparison circuit 100.

It will be appreciated that, for a differential input signal 105 having a value between the two thresholds, when the electronic comparison circuit 100 first powers up, a state of the comparator binary, two-state, output signal 102*a* will be indeterminate. Thus, it is not possible to identify if the differential input signal 105 has a value between the two thresholds, or whether the differential input signal 105 has a value above an upper threshold or below a lower threshold.

Figure 2:
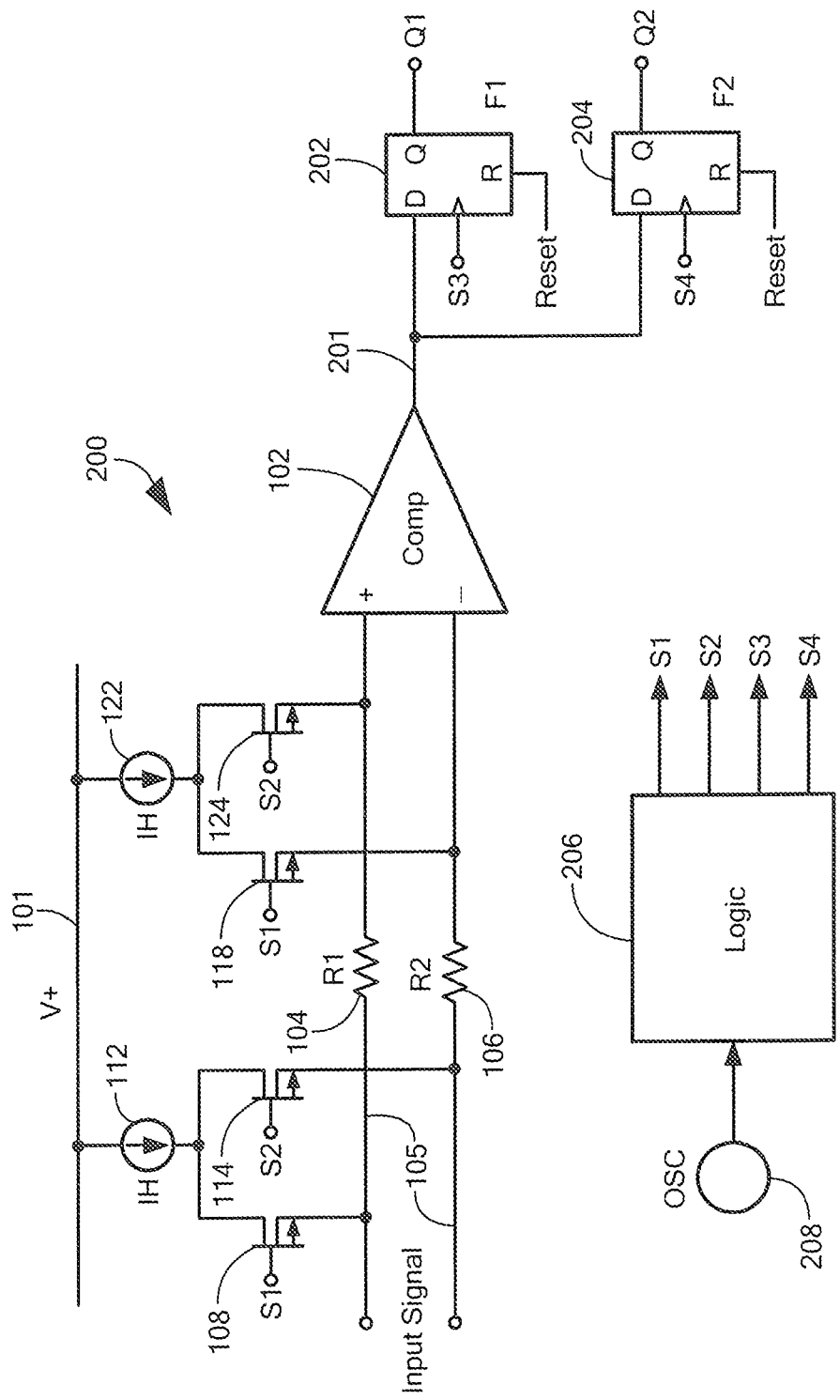
FIG. 2 is a block diagram showing an example of an electronic comparison circuit having a logic circuit and two logic gates.

Referring now to FIG. 2, in which like elements of FIG. 1 are shown having like reference designations, an example of an electronic comparison circuit 200 includes the comparator 102, first and second resistors 104, 106, respectively, first, second, third, and fourth electronic switches 108, 114, 118, 124, respectively, and first and second current sources 112, 122, respectively, all arranged in the same way described above in conjunction with FIG. 1. Here, however, the four electronic switches 108, 114, 118, 124 receive different control signals at control terminals thereof than the control signals described above in conjunction with FIG. 1.

The first electronic switch 108 is operable to pass the first current generated by the first current source 112 between the drain and source terminals of the first electronic switch 108 in response to a first control signal, S1, at the control terminal of the first electronic switch 108.

The second electronic switch 114 is operable to pass the first current generated by the first current source 112 between the drain and source terminals of the second electronic 114 switch in response to a second control signal, S2, at the control terminal of the second electronic switch 114.

The third electronic switch 118 is operable to pass the second current generated by the second current source 122 between the drain and source terminals of the third electronic switch 118 in response to the first control signal, S1, at the control terminal of the third electronic switch 118.

The fourth electronic switch 124 is operable to pass the second current generated by the second current source 122 between the drain and source terminals of the fourth electronic switch in response to the second control signal, S2, at the control terminal of the fourth electronic switch.

While the four electronic switches 108, 114, 118, 124 are show to be field effect transistors, in other embodiments, the electronic switches can be other types of circuit elements, for example, bipolar transistors, triacs, or relays.

Not included in the electronic comparison circuit 100 of FIG. 1, the electronic comparison circuit 200 of FIG. 2 also includes a first logic gate 202 (e.g., a first flip-flop) having an input terminal (e.g., a D terminal), an output terminal (e.g., a Q terminal), and a control terminal (e.g., a clock input terminal). The control terminal of the first logic gate 202 can be coupled to receive a third control signal, S3. The input terminal, D, of the first logic gate 202 is coupled to receive an output signal 201 of the comparator 102. The first logic gate 202 is configured to generate a first output signal, Q1, which can be a first binary, two-state, signal.

The electronic comparison circuit 200 can also include a second logic gate 204 (e.g., a second flip-flop) having an, input terminal (e.g., a D terminal), an output terminal (e.g., a Q terminal), and a control terminal (e.g., a clock input terminal). The control terminal of the second logic gate 204 can be coupled to receive a fourth control signal, S4. The input terminal, D, of the second logic gate 204 is also coupled to receive the output signal 201 of the comparator 102. The second logic gate 204 is configured to generate a second output signal, Q2, which can be a second binary, two-state, signal.

While the first and second logic gates 202, 204, respectively, are show to be flip-flops, in other embodiments, other types of logic gates can be used.

The electronic comparison circuit 200 can also include a logic module 206 operable to generate the first, second, third, and fourth control signals (i.e., S1, S2, S3, and S4). For this embodiment, the first control signal, S1, is coupled to the control terminals of the first and third electronic switches, 108, 118, respectively, the second control signal, S2, is coupled to the control terminals of the second and fourth electronic switches, 114, 124, respectively, the third control signal, S3, is coupled to the control terminal of the first logic gate 202, and the fourth control signal, S4, is coupled to the control terminal of the second logic gate 204. Other control configurations are described below in conjunction with FIGS. 6-9.

The first, second, third, and fourth control signals, S1, S2, S3, S4, operate independently from, but synchronous with, the out signal 201 generated at the output terminal of the comparator 102. The electronic comparison circuit 200 can also include an oscillator 208 configured to generate a clock signal received by the logic module 206.

Operation of the electronic comparison circuit of FIG. 2, and, in particular, operation of the first, second, third, and fourth control signals, S1, S2, S3, S4, respectively, is described more fully below in conjunction with FIG. 3. However, let it suffice here to say that binary states of signals appearing at the output terminals of the first and second logic gates 202, 204 (e.g., the first and second flip-flops) include four possible combinations, and can be used to represent up to four different conditions (or, for example, at least three different conditions) of the differential input signal 105.

A first one of the at least three conditions occurs when a value of the differential input signal 105 is less than a first (e.g., lower) threshold value, a second one of the at least three conditions occurs when a value of the differential input signal 105 is greater than the first (e.g., lower) threshold value and less than a second (e.g., upper) threshold value, and a third one of the at least three conditions occurs when a value of the differential input signal 105 is greater than the second (e.g., upper) threshold value.

In operation, in a first circuit arrangement, the first and third electronic switches 108, 118, respectively, are closed at the same time that the second and fourth electronic switches 114, 124, respectively, are open. In a second circuit arrangement, the first and third electronic switches 108, 118, respectively, are open at the same time that the second and fourth electronic switches 114, 124, respectively, are closed. Other arrangements are described below in conjunction with FIGS. 6-9. The first (e.g., lower) and second (e.g., upper) threshold values are determined in accordance with the currents flowing through, and resistance values of, the first and second resistors, 104, 106, respectively, during the first and second circuit conditions.

It should be understood that, since essentially no current flows into the input terminals of the comparator 102, the currents generated by the current sources 112, 122 (e.g., current generators) are absorbed by the low impedance signal source that generates the differential input signal 105. It is advantageous to inject equal currents at the two (differential) connections to the signal source in order to reduce any offset voltage affects that would occur if unequal voltages were injected.

Currents from flow from right to left through the two resistors.

While the electronic comparison circuit 200 is shown receiving the differential input signal 105, it should be appreciated that the input signal can be single-ended, for example, if one of the input signal terminals is coupled to a reference voltage.

Figure 3:
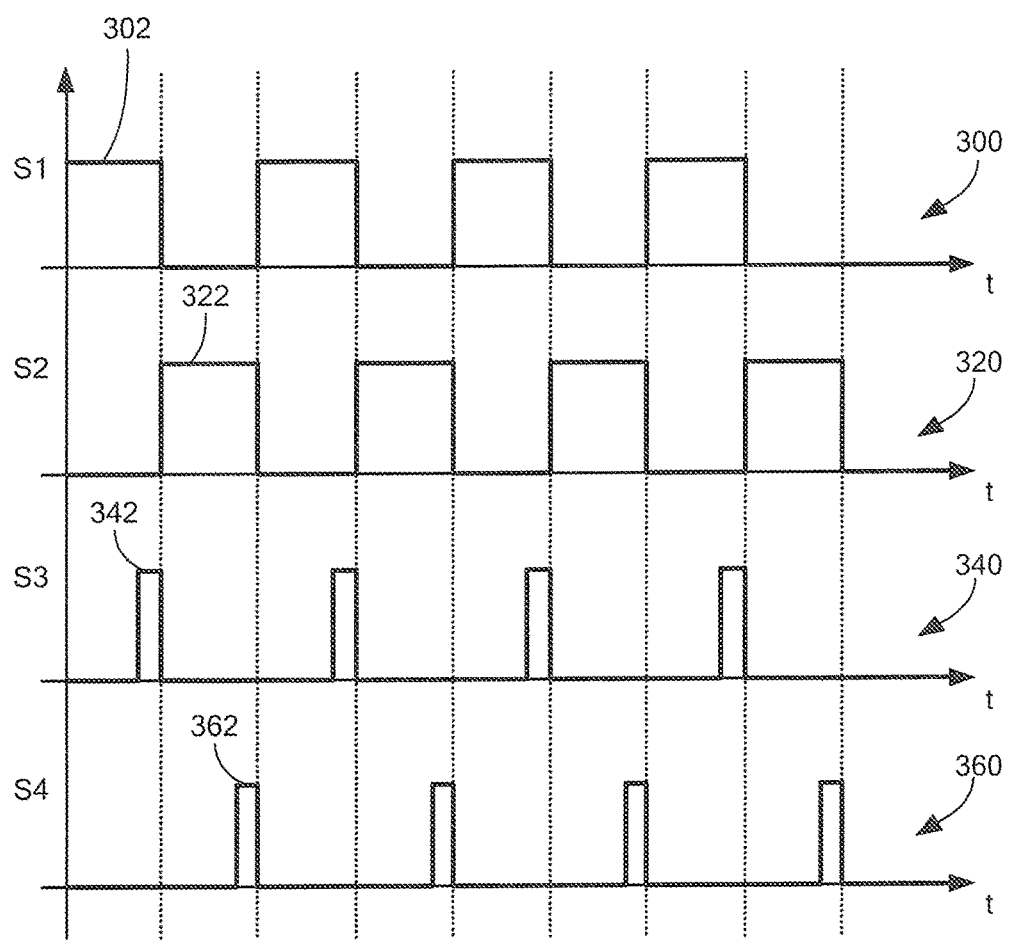
FIG. 3 is a block diagram showing graphs of control signals generated by the logic circuit of FIG. 2.

Referring now to FIG. 3, four graphs 300, 320, 340, 360 have four respective horizontal axes with scales in units of time in arbitrary units and four respective vertical axes with scales in units of voltage in arbitrary units.

A first signal 302 is representative of the first control signal, S1, of FIG. 2, a second signal 322 is representative of the second control signal, S2, of FIG. 2, a third signal 342 is representative of the third control signal, S3, of FIG. 2, and a fourth signal 362 is representative of the fourth control signal, S4, of FIG. 2.

High states of the first and second signals 302, 322 can be representative of closures of the first, second, third, and fourth electronic switches 108, 114, 118, 124 of FIG. 2 to which they are coupled. High states of the third and fourth signals 342, 362 can be representative of latching accomplished by the first and second logic gates 202, 204, respectively, of FIG. 2.

The first and second signals 302, 322 can be one hundred and eighty degrees out of phase with each other, The third signal 342 can have a high state that occurs at any time within a high state of the first signal 302. The fourth signal 362 can have a high state that occurs at any time within a high state of the second signal 322.

In some embodiments, states of the four control signals S1, S2, S3, S4 are not related to, but state transitions are synchronous with, states of the output signal 201 that occurs at the output terminal of the comparator 102.

Referring now to FIG. 4, a table has first second and third columns, The first column indicates particular binary states of the first output signal, Q1, generated by the first logic gate 202 of FIG. 2. The second column indicates particular binary states of the second output signal, Q2, generated by the second logic gate 204 of FIG. 2. The third column indicates conditions of the differential input signal 105 of FIG. 2, which can be represented by states indicated in the first and second columns by operation of the electronic comparison circuit 200 of FIG. 2.

Figure 5:
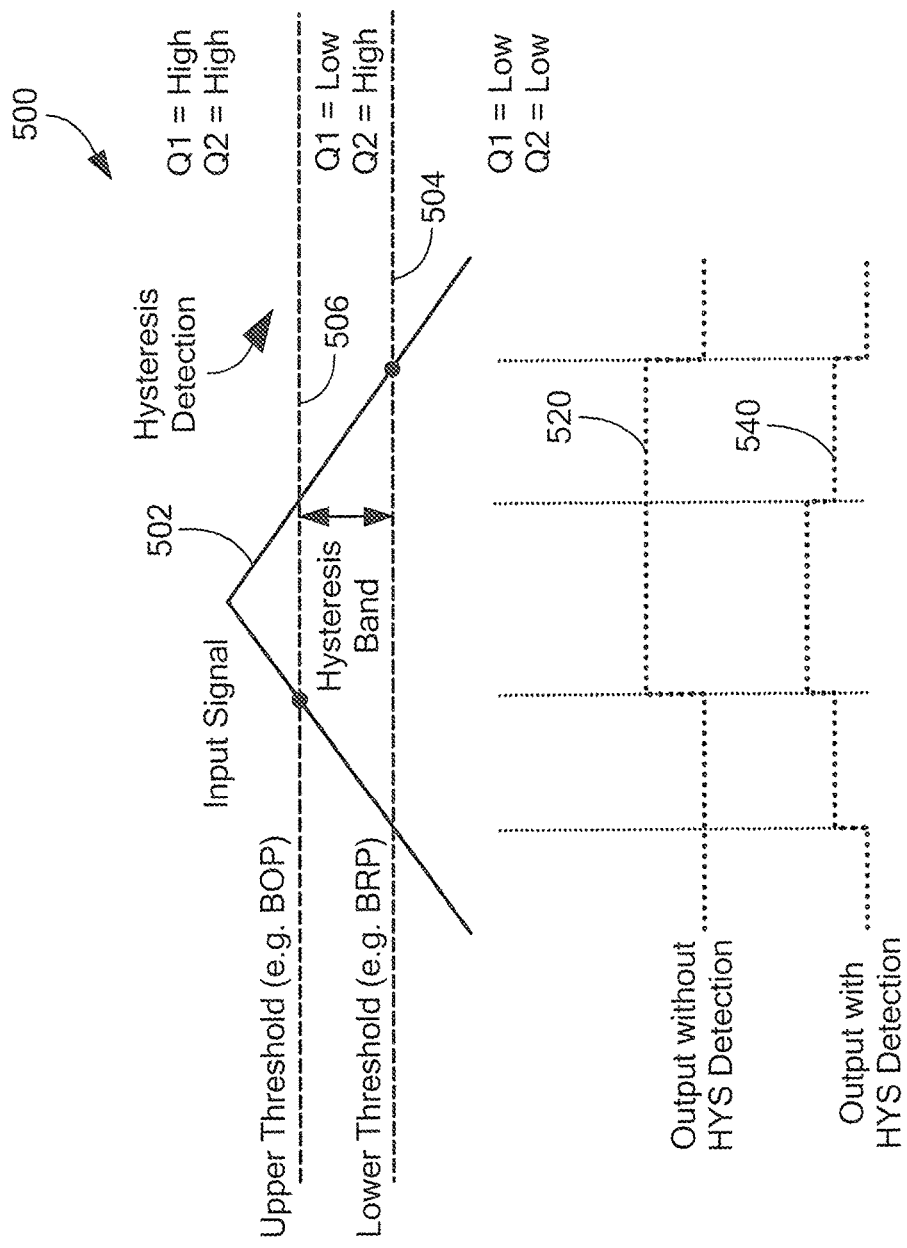
FIG. 5 is a graph showing relationships between amplitudes of a differential input signal received by the electronic comparison circuits of FIGS. 1 and 2 versus output signals generated by the electronic comparison circuits of FIGS. 1 and 2.

Referring now to FIG. 5, an uppermost graph 500 shows, as a triangular shape 502, an amplitude of the differential input signal 105 received by the electrical comparison circuit 200 of FIG. 2 that changes from a low value to a high value and then from the high value back to the low value. The amplitude of the differential input signal 105 crosses a lower threshold 504 and afterwards crosses an upper threshold 506 as the amplitude changes upward. The amplitude of the differential input signal 105 crosses the upper threshold 506 and afterwards the crosses lower threshold 504 as the amplitude changes downward.

States of output signals, Q1, Q2, at the output terminals of the first and second logic gates 202, 204, respectively, of FIG. 2 are shown on the right side of the graph. The states of the output signals, Q1, Q2, take on the conditions shown even when the electronic comparison circuit 200 of FIG. 2 first powers up. Thus, it can be determined by the electronic comparison circuit 200, even when first powered up, whether the differential input signal 105 is above the upper threshold 506, below the lower threshold 504, or between the upper and lower thresholds, 506, 504, respectively.

A second graph 520 is representative of binary states of the binary, two-state, output signal 102a generated at the output terminal of the comparator 102 of FIG. 1. It should be appreciated that, if the differential input signal 105 is between the upper and lower thresholds when the electronic comparison circuit of FIG. 1 first powers up, the binary state of the output signal generated by the comparator of FIG. 1 is not deterministic, and can be in either state.

A third graph 540 is representative of states represented by the first and second output signals, Q1, Q2, of FIG. 2 for the differential input signal 105 within the three ranges indicated in the first graph. It should be appreciated that, if the differential input signal 105 is between the upper and lower thresholds when the electronics comparison circuit 200 of FIG. 2 first powers up, the state represented by the first and second output signals, Q1, Q2, is deterministic.

FIGS. 6-9 below show exemplary alternative arrangements of electronic comparison circuits.

Figure 6:
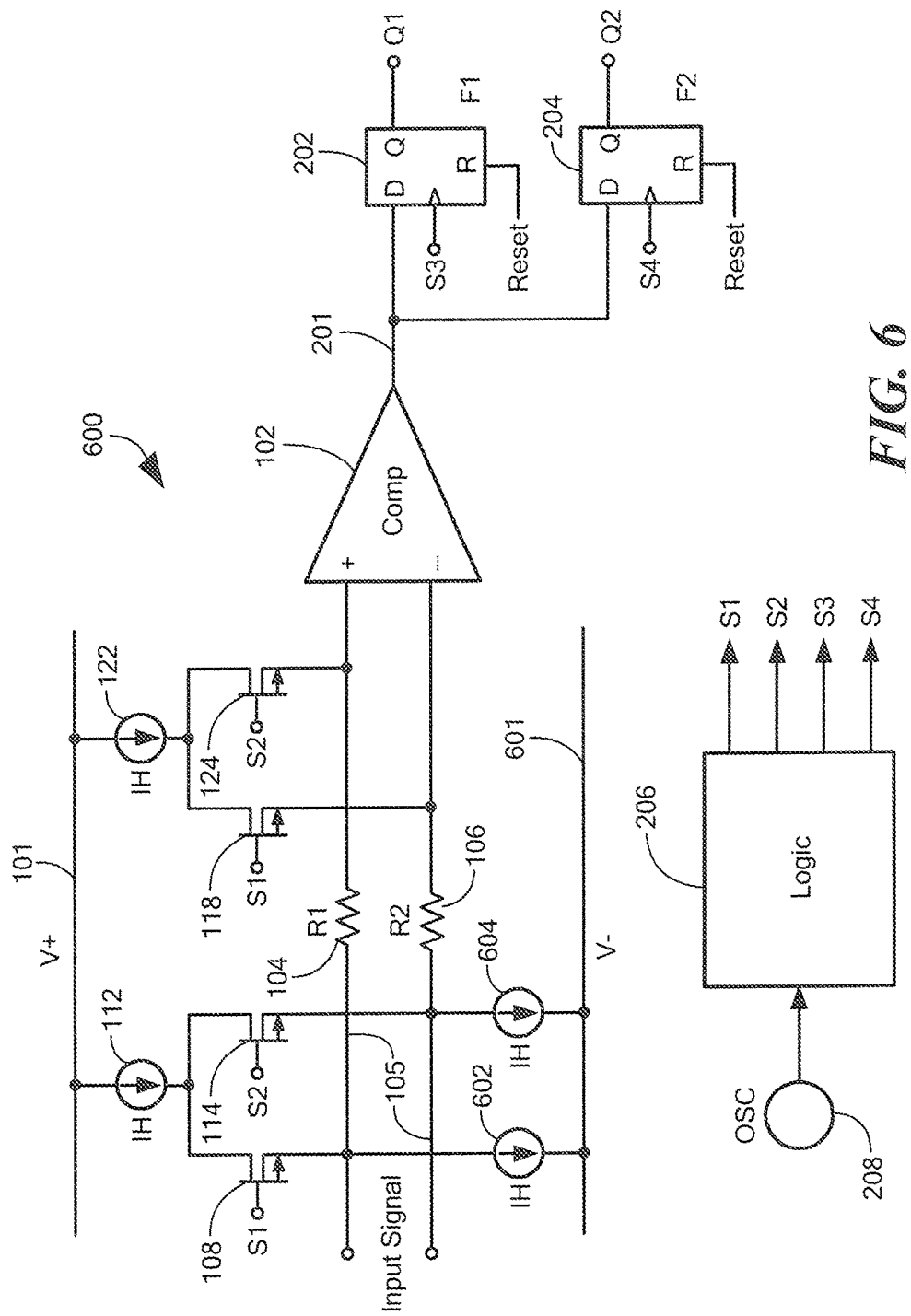
FIG. 6 is a block diagram of showing another example of an electronic comparison circuit.

Referring now to FIG. 6, in which like elements of FIG. 2 are shown having like reference designations, an example of an electronic comparison circuit 600 is like the comparison circuit of FIG. 2 and operates in substantially the same way with substantially the same first, second, third, and fourth control signals, S1, S2, S3, S4 described above in conjunction with FIGS. 2 and 3. However, the electronic comparison circuit of FIG. 6 includes first and second current sinks 602, 604 (e.g., current generators). The first current sink 602 is coupled to the first end of the first resistor 104 and a second current sink 604 is coupled to the first end of the second resistor 106.

The first and second current sinks 602, 604 essentially absorb the currents generated by the first and second current sources 112, 122, and therefore, the signal source that generates the differential input signal 105 does not have to absorb the currents.

Currents from flow from right to left through the first and second resistors 104, 106.

Figure 7:
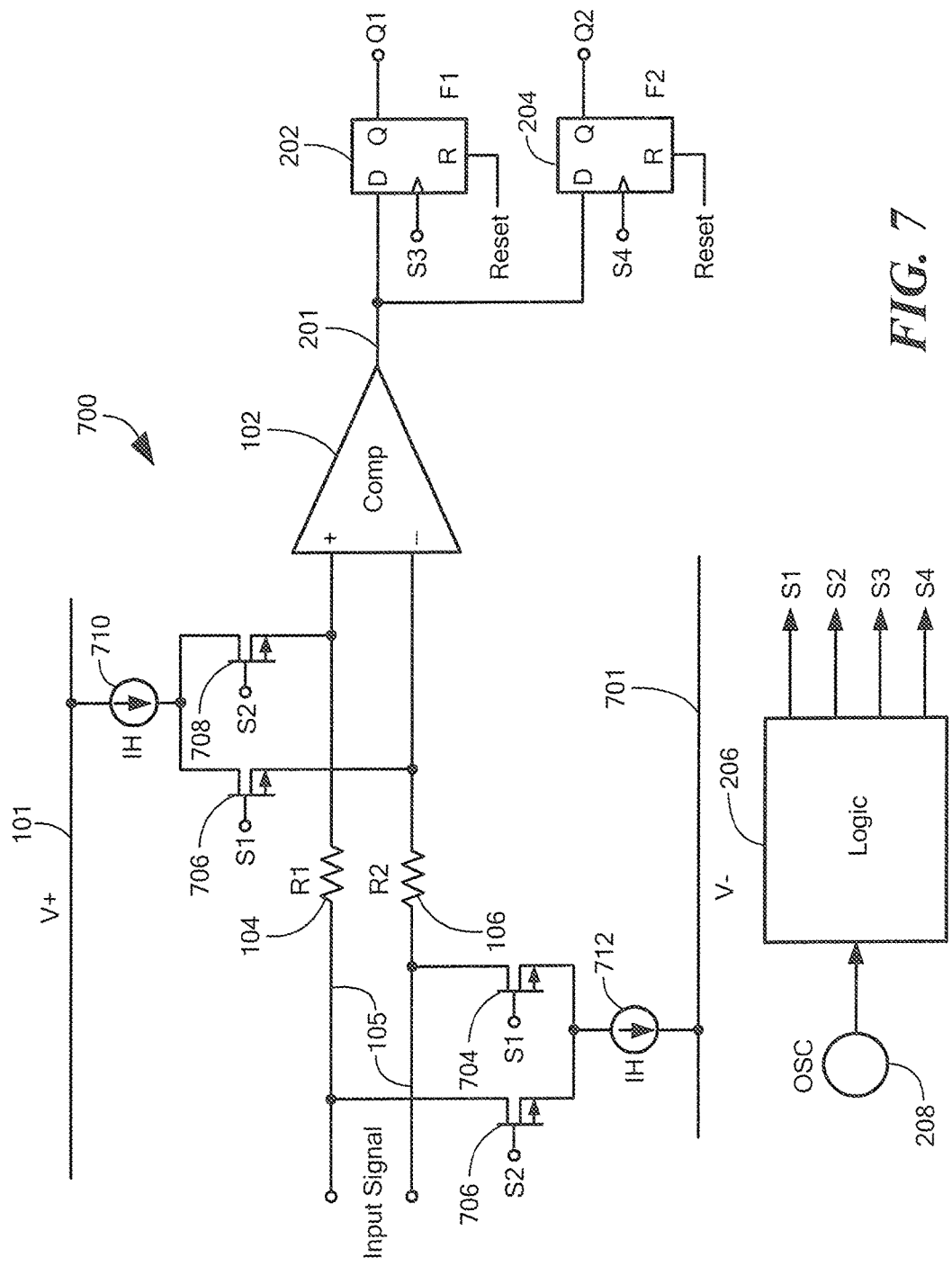
FIG. 7 is a block diagram of showing another example of an electronic comparison circuit.

Referring now to FIG. 7, in which like elements of FIG. 2 are shown having like reference designations, another example of an electronic comparison circuit 700 is like the electronic comparison of circuit 200 of FIG. 2 a and operates in substantially the same way with substantially the same first, second, third, and fourth control signals, S1, S2, S3, S4 described above in conjunction with FIGS. 2 and 3.

A first electronic switch 702 (e.g., first field effect transistor) has a first current conducting terminal (e.g., a drain terminal), a second current conducting terminal (e.g., a source terminal), and a control terminal (e.g., a gate terminal). The first electronic switch 702 is operable to pass a first current generated by a current sink 712 between the drain and source terminals of the first electronic switch 702 in response to a second control signal, S2, at the control terminal of the first electronic switch 702. The drain terminal of the first electronic switch 702 is coupled to the first end of the first resistor 104.

A second electronic switch 704 (e.g., second field effect transistor) has a first current conducting terminal (e.g., a drain terminal), a second current conducting terminal (e.g., a source terminal), and a control terminal (e.g., a gate terminal). The second electronic switch 704 is operable to pass the first current generated by the current sink 712 between the drain and source terminals of the second electronic switch 704 in response to a first control signal, S1, at the control terminal of the second electronic switch 704. The drain terminal of the second electronic switch 704 is coupled to the first end of the second resistor 106.

A third electronic switch 706 (e.g., third field effect transistor) has a first current conducting terminal (e.g., a drain terminal), a second current conducting terminal (e.g., a source terminal), and a control terminal (e.g., a gate terminal). The third electronic switch 706 is operable to pass a second current generated by a current source 710 between the drain and source terminals of the third electronic switch 706 in response to the first control signal, S1, at the control terminal of the third electronic switch 706. The source terminal of the third electronic switch 706 is coupled to the second end of the second resistor 106.

A fourth electronic switch 708 (e.g., fourth field effect transistor) has a first current conducting terminal (e.g., a drain terminal), a second current conducting terminal (e.g., a source terminal), and a control terminal (e.g., a gate terminal). The fourth electronic switch 708 is operable to pass the second current generated by the current source 710 between the drain and source terminals of the fourth electronic switch 708 in response to the second control signal, S2, at the control terminal of the fourth electronic switch 708. The source terminal of the fourth electronic switch 708 is coupled to the second end of the first resistor 104.

Control terminals of the second and third electronic switches 704, 706, respectively, are coupled to receive the first control signal, S1.

Control terminals of the first and fourth electronic switches 702, 708, respectively, are coupled to receive the second control signal, S2.

As described above, the first and second currents that set upper and lower threshold values (see, e.g., FIG. 5) are generated by the current sink 712, and by the current source 710, respectively, (i.e., current generators) coupled to the sources of the first and second electronic switches 701, 704, and to the drains of the third and fourth electronic switches 706, 708, respectively. The currents generated by the current sink 712 and by the current source 710 can have the same value of current.

Similar to the electronic comparison circuit 600 of FIG. 6, current from the current source 710 is absorbed by the current sink 712, and therefore, the signal source that generates the differential input signal 105 does not have to absorb the currents.

Currents from flow from right to left through the two resistors.

Figure 8:
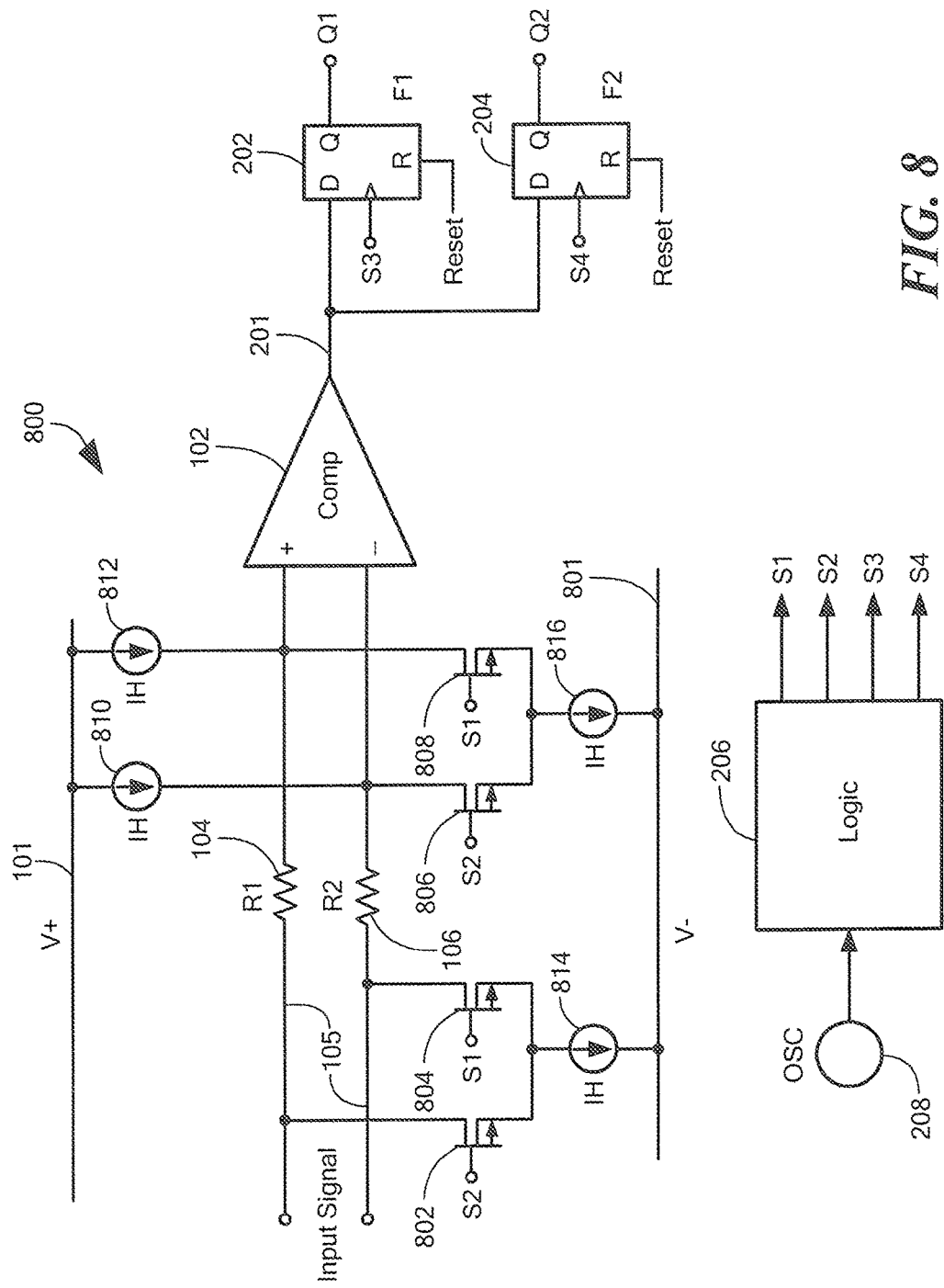
FIG. 8 is a block diagram of showing another example of an electronic comparison circuit.

Referring now to FIG. 8, in which like elements of FIG. 2 are shown having like reference designations, another example of an electronic comparison circuit 800 is like the electronic comparison circuit 200 of FIG. 2 and operates in substantially the same way with substantially the same first, second, third, and fourth control signals, S1, S2, S3, S4 described above in conjunction with FIGS. 2 and 3. Similar to the electronic comparison circuit of 600 FIG. 6, current from the first and second current sources 810, 812 is absorbed by first and second current sinks 814, 816, and therefore, the signal source that generates the differential input signal 105 does not have to absorb the currents.

A first electronic switch 802 (e.g., first field effect transistor) has a first current conducting terminal (e.g., a drain terminal), a second current conducting terminal (e.g., a source terminal), and a control terminal (e.g., a gate terminal). The first electronic switch 802 is operable to pass a first current generated by a first current sink 814 between the drain and source terminals of the first electronic switch 802 in response to a second control signal, S2, at the control terminal of the first electronic switch 802. The drain terminal of the first electronic switch 802 is coupled to the first end of the first resistor 104.

A second electronic switch 804 (e.g., second field effect transistor) has a first current conducting terminal (e.g., a drain terminal), a second current conducting terminal (e.g., a source terminal), and a control terminal (e.g., a gate terminal). The second electronic switch 804 is operable to pass the first current generated by the first current sink 814 between the drain and source terminals of the second electronic switch 804 in response to a first control signal, S1, at the control terminal of the second electronic switch 804.

The drain terminal of the second electronic switch 804 is coupled to the first end of the second resistor 106.

A third electronic switch 806 (e.g., third field effect transistor) has a first current conducting terminal (e.g., a drain terminal), a second current conducting terminal (e.g., a source terminal), and a control terminal (e.g., a gate terminal). The third electronic switch 806 is operable to pass a second current generated by a second current sink 816 between the drain and source terminals of the third electronic switch 806 in response to the second control signal, S2, at the control terminal of the third electronic switch 806. The source terminal of the third electronic switch 806 is coupled to the second end of the second resistor 106.

A fourth electronic switch 808 (e.g., fourth field effect transistor) has a first current conducting terminal (e.g., a drain terminal), a second current conducting terminal (e.g., a source terminal), and a control terminal (e.g., a gate terminal). The fourth electronic switch 808 is operable to pass the second current generated by the second current sink 818 between the drain and source terminals of the fourth electronic switch 808 in response to the first control signal, S1, at the control terminal of the fourth electronic switch 808. The source terminal of the fourth electronic switch 808 is coupled to the second end of the first resistor 104.

A first current source 810 is coupled to provide a current to the second end of the second resistor 106 and a second current source 812 is coupled to provide a current to the second end to the first resistor 104. The first and second current sources 810, 812, respectively, generate currents that would otherwise be generated by the low impedance signal source that generates the differential input signal 105.

Control terminals of the second and fourth electronic switches 804, 808, respectively, are coupled to receive the first control signal, S1.

Control terminals of the first and third electronic switches 802, 806, respectively, are coupled to receive the second control signal, S2.

As described above, the first and second currents that set upper and lower threshold values (see, e.g., FIG. 5) are generated by the first current sink 814 and by the second current sink 816 (i.e., current generators) coupled to the sources of the first, second, third, and fourth electronic switches 802, 804, 806, 808, respectively. The currents generated by the first current sink 814 and by the second current sink 818 can have the same value of current.

Currents from flow from right to left through the first and second resistors 104, 106.

Figure 9:
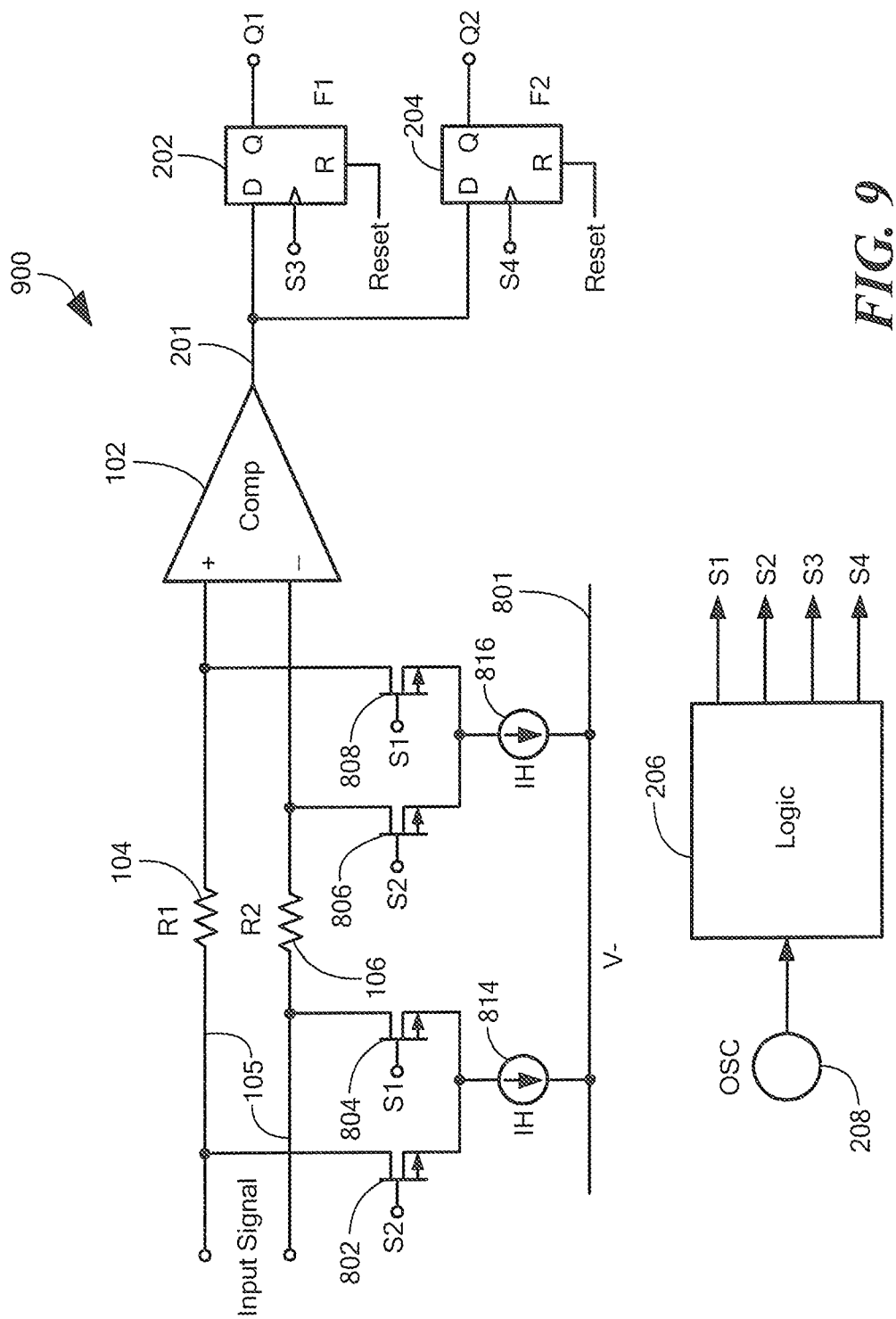
FIG. 9 is a block diagram of showing another example of an electronic comparison circuit.

Referring now to FIG. 9, in which like elements of FIGS. 2 and 8 are shown having like reference designations, another example of an electronic comparison circuit 900 is like the electronic comparison circuits 200, 800 of FIGS. 2 and 8 and operates in substantially the same way. The electronic comparison circuit 900 does not include the current sources 810, 812 of FIG. 8, and therefore, similar to operation of the electronic comparison circuit 200 of FIG. 2, current from current sinks 814, 816 must be generated by the signal source that generates the differential input signal 105.

Currents from flow from left to right through the first and second resistors 104, 106.

In the electronic comparison circuits of FIGS. 2 and 6-9 above, it is shown that the various current generators in each figure generate currents of the same value. In alternate embodiments, some of the current generators in each figure can generate a different value of current than other current generators in each figure.

In the electronic comparison circuits of FIGS. 2 and 6-9 above, it is also shown that the first and second resistors have the same value. In other embodiments, the first and second resistors in each figure have different values.

Figure 10:
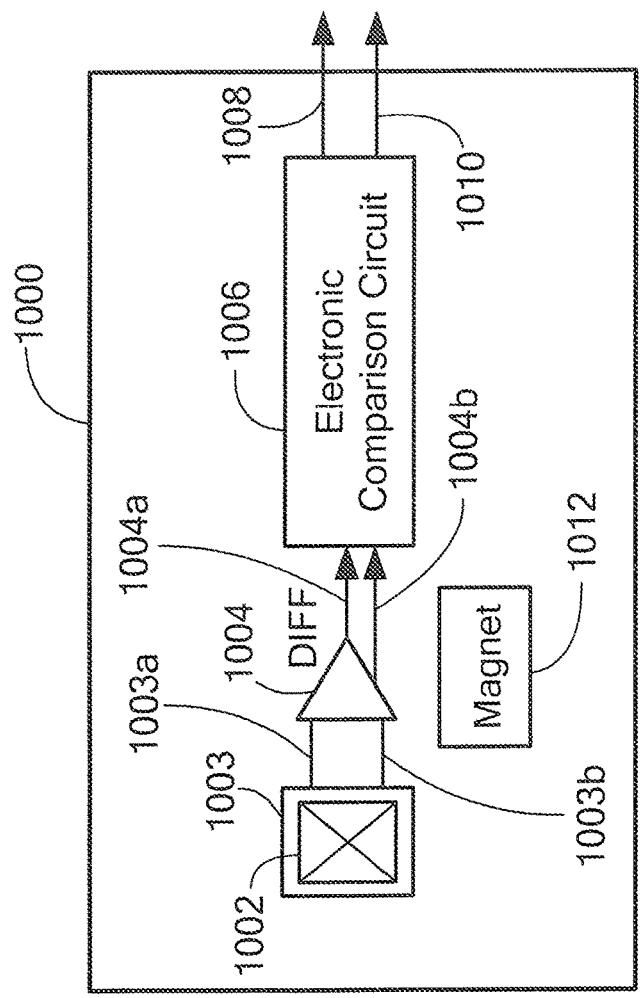
FIG. 10 is a block diagram of showing an example of a magnetic field sensor using an electronic comparison circuit that can be like the electronic comparison circuits of FIGS. 2, and 6-9.
Figure 10:
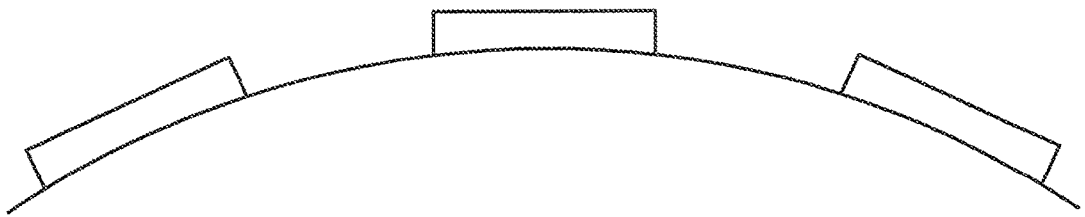

Referring now to FIG. 10, a magnetic field sensor 1000 can be responsive to a ferromagnetic object, for example, passing teeth of a ferromagnetic gear. The magnetic field sensor 1000 can include one or more magnetic field sensing elements, here shown to be a Hall effect element 1002.

A switching network 1003 can be coupled to the Hall element 1002, and can provide current spinning, or chopping, of the Hall element 1002. Current spinning is a known technique in which couplings to the Hall element are sequentially changed in order to result in a lower DC offset voltage from the Hall element.

A differential output signal 1003a, 1003b can result from the current spinning. The differential output signal 1003a, 1003b is a magnetic field signal responsive to a magnetic field.

A magnet 1012 can be disposed within the magnetic field sensor 1000 and/or proximate to the Hall effect element 1002. Passing gear teeth cause a magnetic field experienced by the Hall element 1002 to fluctuate, and thus, the differential magnetic field signal 1003a, 1003b has an AC component as the gear rotates.

A differential amplifier 1004 can be coupled to receive the differential signal 1003a, 1003b and configured to generate a differential amplified signal 1004a, 1004b. An electronic comparison circuit 1006 can be coupled to receive the differential amplified signal 1004a, 1004b, and configured to generate at least two binary, two-state, output signals 1008, 1010. The electronic comparison circuit 1006 can be the same as or similar to any one of the electronic comparison circuits of FIGS. 2 and 6-9. Thus, the at least two binary output signals 1008, 1010 can be the same as or similar to any of the binary signal Q1, Q2 of FIGS. 2 and 6-9.

With this arrangement, the magnetic field sensor 1000, upon power up, is deterministic, and can properly identify if the Hall element 1002 is proximate to a gear tooth, to a gear valley, or to an edge of the gear tooth.

In some embodiments, the amplifier 1004 includes an automatic gain control function. In some alternate embodiments, the magnetic field sensor 1000 is responsive instead to ring magnet having alternating north and south poles, and the magnet 1012 is not used.

In some alternate embodiments, current spinning is not used, in which case, the switching network 1003 is not used.

In some alternate embodiments, a filter circuit (not shown) is disposed between the amplifier 1004 and the electronic comparison circuit 1006.

Figure 11:
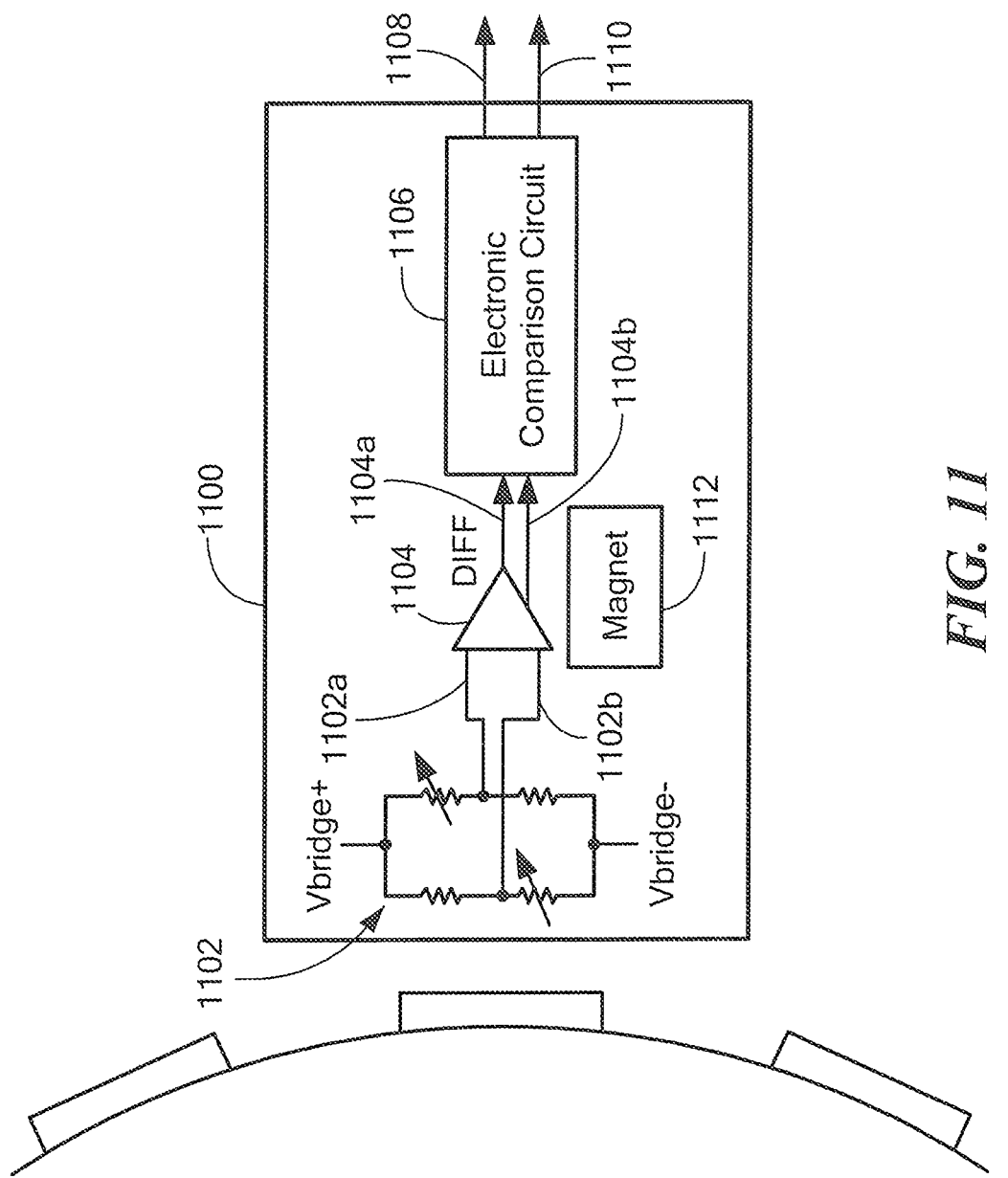
FIG. 11 is a block diagram of showing another example of a magnetic field sensor using an electronic comparison circuit that can be like the electronic comparison circuits of FIGS. 2, and 6-9.

Referring now to FIG. 11, a magnetic field sensor 1100 can be responsive to a ferromagnetic object, for example, passing teeth of a ferromagnetic gear, The magnetic field sensor 1100 can include one or more magnetic field sensing elements, here shown to be the two magnetoresistance elements coupled in a bridge arrangement 1102.

A differential output signal 1102a, 1102b can result from the bridge arrangement 1102. The differential output signal 1102a, 1102b is a magnetic field signal responsive to a magnetic field.

A magnet 1112 can be disposed within the magnetic field sensor 1100 and proximate to the bridge arrangement 1102. Passing gear teeth cause a magnetic field experienced by the bridge arrangement 1102 to fluctuate, and thus, the differential magnetic field signal 1102a, 1102b has an AC component as the gear rotates.

A differential amplifier 1104 can be coupled to receive the differential signal 1102a, 1102b and configured to generate a differential amplified signal 1104a, 1104b. An electronic comparison circuit 1106 can be coupled to receive the differential amplified signal 1104a, 1104b, and configured to generate at least two binary, two-state, output signals 1108, 1110. The electronic comparison circuit 1106 can be the same as or similar to any one of the electronic comparison circuits of FIGS. 2 and 6-9. Thus, the at least two binary output signals 1108, 1110 can be the same as or similar to any of the binary signal Q1, Q2 of FIGS. 2 and 6-9.

With this arrangement, the magnetic field sensor 1100, upon power up, is deterministic, and can properly identify if the Hall element 1002 is proximate to a gear tooth, to a gear valley, or to an edge of the gear tooth.

In some embodiments, the amplifier 1104 includes an automatic gain control function, In some alternate embodiments, the magnetic field sensor 1100 is responsive instead to ring magnet having alternating north and south poles, and the magnet 1112 is not used.

In some alternate embodiments, a filter circuit (not shown) is disposed between the amplifier 1104 and the electronic comparison circuit 1106.

While FIGS. 10 and 11 show magnetic field sensors that are responsive to a rotating ferromagnetic object, in other arrangements, similar magnetic field sensors can instead be responsive to a proximity of the magnet, in which arrangements, the magnets shown within the magnetic field sensors 1000, 1100 are not used.

While field effect transistors are shown to form the electronic switches of FIGS. 2 and 6-9 above, other types of electronic switches can be used, for example, bipolar transistors, triacs, or relays.

While particular types of field effect transistors (e.g., N-channel MOSFETs) are implied by the field effect transistors symbols of FIGS. 2 and 6-9, some of, or all of, the field effect transistors can be another type of field effect transistors (e.g., P-channel MOSFETs, N-channel JFETs, P-channel JFETs).

While a variety of binary, two state, signals are described herein, in other embodiments, any of the binary, two-state, signals can instead by multi-bit digital signals having at least two states.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A circuit comprising:
a comparison circuit, the comparison circuit comprising:
a comparator having first and second comparator inputs and a comparator output;
a first switching circuit having a first terminal coupled to the first comparator input and a second terminal coupled to the second comparator input, and a second switching circuit having a first terminal coupled to the first comparator input and a second terminal coupled to the second comparator input, each switching circuit comprising two transistors and a current source output coupled between the two transistors;
first and second logic gates coupled to the output of the comparator, each of the logic gates having a control terminal to be coupled to different control signal outputs of a logic circuit, wherein when the control signals of the logic circuit are modulated an output signal of the first logic gate and an output signal of the second logic gate together have one of first, second and third states corresponding to one of first, second and third conditions, respectively, of an input signal to the comparison circuit.

2. The circuit of claim 1 wherein said output signals are generated immediately upon power up of the comparison circuit.

3. The circuit of claim 1, wherein the comparison circuit comprises one and only one comparator.

4. The circuit of claim 1, wherein the first condition occurs whenever a value of the input signal is less than a first threshold value, the second condition occurs whenever the value of the input signal is greater than the first threshold value and less than a second threshold value, and the third condition occurs whenever the value of the input signal is greater than the second threshold value.

5. The circuit of claim 1, further comprising at least one magnetic field sensing element responsive to a magnetic field to generate the input signal to the comparison circuit.

6. The circuit of claim 5, wherein the least one magnetic field sensing element comprises a Hall element.

7. The circuit of claim 5, wherein the least one magnetic field sensing element comprises a magnetoresistance element.

8. The circuit of claim 1, further comprising a first resistor coupled between the first terminal of the first switching circuit and the first terminal of the second switching circuit, and a second resistor coupled between the second terminal of the first switching circuit and the second terminal of the second switching circuit.

9. The circuit of claim 1, wherein binary states of output signals generated at the output terminals of the first and second logic gates are indicative of at least three conditions of the input signal.

10. The circuit of claim 9, wherein a first one of the at least three conditions occurs when a value of the input signal is less than a first threshold value, a second one of the at least three conditions occurs when a value of the input signal is greater than the first threshold value and less than a second threshold value, and a third one of the at least three conditions occurs when a value of the input signal is greater than the second threshold value.

11. The circuit of claim 10, wherein the first and second terminals conduct currents that are equal currents.

12. The circuit of claim 10, wherein the first and second terminals conduct currents that are not equal currents.

13. The circuit of claim 10, wherein the currents between the two transistors of the first and second switching circuits are equal currents.

14. The circuit of claim 10, wherein the currents between the two transistors of the first and second switching circuits are not equal currents.

15. The circuit of claim 8, further comprising:
a third current generator coupled to the first end of the first resistor, wherein the third current generator is operable to generate a third current; and
a fourth current generator coupled to the first end of the second resistor, wherein the fourth current generator is operable to generate a fourth current.

16. The circuit of claim 15, wherein the currents between the resistors are equal currents.

17. The circuit of claim 15, wherein the currents between the resistors are not equal to one another.

18. The circuit of claim 10, wherein the control signals are synchronous with each other.

19. The circuit of claim 10, wherein the input signal is a differential signal received at the first end of the first resistor and the first end of the second resistor.

20. The circuit of claim 10, wherein the transistors are field effect transistors.

21. The circuit of claim 10, wherein the first logic gate comprises a first flip-flop and the second logic gate comprises a second flip-flop.

22. The circuit of claim 10, further comprising:
at least one magnetic field sensing element configured to generate a magnetic field signal responsive to a magnetic field, wherein the input signal is representative of the magnetic field signal.

23. The circuit of claim 22, wherein the at least one magnetic field sensing element comprises a magnetoresistance element.

24. An electronic comparison circuit, comprising:
a comparator having an inverting terminal, a non-inverting terminal, and an output terminal;
a first resistor having first and second ends, wherein the second end of the first resistor is coupled to the non-inverting terminal;
a second resistor having first and second ends, wherein the second end of the second resistor is coupled to the inverting terminal, wherein at least one of the first end of the first resistor or the first end of the second resistor is coupled to receive an input signal;
a first electronic switch having a first current conducting terminal, a second current conducting terminal, and a control terminal, wherein the first electronic switch is operable to pass a first current between the first and second current conducting terminals of the first electronic switch in response to a signal at the control terminal, wherein the second current conducting terminal of the first electronic switch is coupled to the first end of the first resistor;
a second electronic switch having a first current conducting terminal, a second current conducting terminal, and a control terminal, wherein the second electronic switch is operable to pass the first current between the first and second current conducting terminals of the second electronic switch in response to a signal at the control terminal, wherein the second current conducting terminal of the second electronic switch is coupled to the first end of the second resistor;
a third electronic switch having a first current conducting terminal, a second current conducting terminal, and a control terminal, wherein the third electronic switch is operable to pass a second current between the first and second current conducting terminals of the third electronic switch in response to a signal at the control terminal, wherein the second current conducting terminal of the third electronic switch is coupled to the second end of the second resistor;
a fourth electronic switch having a first current conducting terminal, a second current conducting terminal, and a control terminal, wherein the fourth electronic switch is operable to pass the second current between the first and second current conducting terminals of the fourth electronic switch in response to a signal at the control terminal, wherein the second current conducting terminal of the fourth electronic switch is coupled to the second end of the first resistor;
a first logic gate having an input terminal, an output terminal, and a control terminal, wherein the input terminal of the first logic gate is coupled to the output terminal of the comparator;
a second logic gate having an input terminal, an output terminal, and a control terminal, wherein the input terminal of the second logic gate is coupled to the output terminal of the comparator; and
a logic module operable to generate first, second, third, and fourth control signals, wherein the first control signal is coupled to the control terminals of a selected two the first, second, third and fourth electronic switches, the second control signal is coupled to the control terminals of a different selected two of the first, second, third, and fourth electronic switches, the third control signal is coupled to the control terminal of the first logic gate, and the fourth control signal is coupled to the control terminal of the second logic gate.

25. The electronic comparison circuit of claim 24, wherein binary states of output signals generated at the output terminals of the first and second logic gates are indicative of at least three conditions of the input signal.

26. The electronic comparison circuit of claim 25, wherein a first one of the at least three conditions occurs when a value of the input signal is less than a first threshold value, a second one of the at least three conditions occurs when a value of the input signal is greater than the first threshold value and less than a second threshold value, and a third one of the at least three conditions occurs when a value of the input signal is greater than the second threshold value.

27. The electronic comparison circuit of claim 26, wherein the first and second currents are equal currents.

28. The electronic comparison circuit of claim 26, wherein the first and second currents are not equal currents.

29. The electronic comparison circuit of claim 26, further comprising:
a first current generator coupled to the first current conducting terminal of the first electronic switch and to the first current conducting terminal of the second electronic switch, wherein the first current generator is operable to generate the first current; and
a second current generator coupled to the first current conducting terminal of the third electronic switch and to the first current conducting terminal of the fourth electronic switch, wherein the second current generator is operable to generate the second current.

30. The electronic comparison circuit of claim 29, wherein the first and second currents are equal currents.

31. The electronic comparison circuit of claim 29, wherein the first and second currents are not equal currents.

32. The electronic comparison circuit of claim 29, further comprising:
a third current generator coupled to the first end of the first resistor, wherein the third current generator is operable to generate a third current; and
a fourth current generator coupled to the first end of the second resistor, wherein the fourth current generator is operable to generate a fourth current.

33. The electronic comparison circuit of claim 32, wherein the first, second, third, and fourth currents are equal currents.

34. The electronic comparison circuit of claim 32, wherein at least one of the first, second, third, or fourth currents is not equal to another one of the first, second, third, and fourth currents.

35. The electronic comparison circuit of claim 26, wherein the first, second, third, and fourth control signals are synchronous with each other.

36. The electronic comparison circuit of claim 26, wherein the input signal is a differential signal received at the first end of the first resistor and the first end of the second resistor.

37. The electronic comparison circuit of claim 26, wherein the first electronic switch comprises a first field effect transistor, the second electronic switch comprises a second field effect transistor, the third electronic switch comprises a third field effect transistor, the fourth electronic switch comprises a fourth field effect transistor.

38. The electronic comparison circuit of claim 26, wherein the first logic gate comprises a first flip-flop and the second logic gate comprises a second flip-flop.

39. The electronic comparison circuit of claim 26, further comprising:
    at least one magnetic field sensing element configured to generate a magnetic field signal responsive to a magnetic field, wherein the input signal is representative of the magnetic field signal.

40. The electronic comparison circuit of claim 39, wherein the at least one magnetic field sensing element comprises a Hall element.

41. The electronic comparison circuit of claim 39, wherein the at least one magnetic field sensing element comprises a magnetoresistance element.

* * * * *

UNITED STATES PATENT AND TRADEMARK OFFICE
CERTIFICATE OF CORRECTION

| | |
|---|---|
| PATENT NO. | : 10,006,970 B2 |
| APPLICATION NO. | : 14/661042 |
| DATED | : June 26, 2018 |
| INVENTOR(S) | : Manuel Rivas et al. |

It is certified that error appears in the above-identified patent and that said Letters Patent is hereby corrected as shown below:

FIG. 6, delete left most "706" and replace with --"702--.

Column 1, Line 52, delete "comparators first powers" and replace with --comparator first powers--.

Column 2, Lines 19-20, delete "rotates or an a" and replace with --rotates or a--.

Column 2, Line 25, delete "can to generate" and replace with --can generate--.

Column 4, Line 19, delete "field, the" and replace with --field. The--.

Column 4, Line 47, delete "diagram of showing" and replace with --diagram showing--.

Column 4, Line 49, delete "diagram of showing" and replace with --diagram showing--.

Column 4, Line 51, delete "diagram of showing" and replace with --diagram showing--.

Column 4, Line 53, delete "diagram of showing" and replace with --diagram showing--.

Column 4, Line 55, delete "diagram of showing" and replace with --diagram showing--.

Column 4, Line 59, delete "diagram of showing" and replace with --diagram showing--.

Column 5, Line 51, delete "operations, The" and replace with --operations. The--.

Column 5, Line 63, delete "be an analog or digital" and replace with --be analog or digital--.

Column 6, Line 5, delete "circuit shown" and replace with --circuits shown--.

Column 6, Line 30, delete "describe and" and replace with --describe an--.

Signed and Sealed this
Eighth Day of January, 2019

Andrei Iancu
*Director of the United States Patent and Trademark Office*

CERTIFICATE OF CORRECTION (continued)
U.S. Pat. No. 10,006,970 B2

Column 6, Lines 33-34, delete "as used" and replace with --is used--.

Column 7, Line 38, delete "also be possible" and replace with --also possible--.

Column 7, Line 67, delete "an state of" and replace with --a state of--.

Column 8, Line 66, delete "are show to be" and replace with --are shown to be--.

Column 9, Line 61, delete "currents from flow" and replace with --currents flow--.

Column 10, Line 48, delete "afterwards the crosses" and replace with --afterwards crosses the--.

Column 11, Line 28, delete "currents from flow" and replace with --currents flow--.

Column 11, Line 33, delete "FIG. 2 a and" and replace with --FIG. 2 and--.

Column 12, Line 34, delete "Currents from flow" and replace with --currents flow--.

Column 13, Line 20, delete "818" and replace with --816--.

Column 13, Line 45, delete "818" and replace with --816--.

Column 13, Line 46, delete "currents from flow" and replace with --currents flow--.

Column 13, Line 58, delete "currents from flow" and replace with --currents flow--.

Column 14, Line 42, delete "to ring magnet" and replace with --to a ring magnet--.

Column 14, Line 53, delete "shown to be the two" and replace with --shown to be two--.

Column 15, Line 11, delete "Hall element 1002" and replace with --bridge arrangement 1102--.

Column 15, Line 16, delete "to ring" and replace with --to a ring--.

Column 15, Line 39, delete "instead by" and replace with --instead be--.

Column 15, Line 48, delete "that that scope" and replace with --that the scope--.

Column 18, Line 8, delete "two the first" and replace with --two of the first--.